(12) United States Patent
Nishigaki et al.

(10) Patent No.: US 7,767,608 B2
(45) Date of Patent: Aug. 3, 2010

(54) DIELECTRIC CERAMIC-FORMING COMPOSITION

(75) Inventors: Kyouichi Nishigaki, Tokyo (JP); Shinji Tanabe, Tokyo (JP); Naoaki Narishige, Tokyo (JP)

(73) Assignee: Nippon Chemical Industrial Co., Ltd., Tokyo (JP)

( * ) Notice: Subject to any disclaimer, the term of this patent is extended or adjusted under 35 U.S.C. 154(b) by 134 days.

(21) Appl. No.: 11/909,426

(22) PCT Filed: Mar. 20, 2006

(86) PCT No.: PCT/JP2006/305487

§ 371 (c)(1), (2), (4) Date: Sep. 21, 2007

(87) PCT Pub. No.: WO2006/101059

PCT Pub. Date: Sep. 28, 2006

(65) Prior Publication Data

US 2008/0280748 A1    Nov. 13, 2008

(30) Foreign Application Priority Data

Mar. 22, 2005 (JP) .............................. 2005-082016

(51) Int. Cl.
*C04B 35/465* (2006.01)
*C04B 35/468* (2006.01)

(52) U.S. Cl. ........................ 501/135; 501/136; 501/137; 501/138; 501/139

(58) Field of Classification Search ......... 501/137–139, 501/135, 136
See application file for complete search history.

(56) References Cited

U.S. PATENT DOCUMENTS

| | | | | |
|---|---|---|---|---|
| 5,258,338 A | * | 11/1993 | Maher | 501/137 |
| 5,350,721 A | * | 9/1994 | Abe et al. | 501/139 |
| 5,458,981 A | * | 10/1995 | Abe et al. | 428/471 |
| 5,757,610 A | * | 5/1998 | Wada et al. | 361/311 |
| 6,074,970 A | * | 6/2000 | Yamashita et al. | 501/138 |
| 6,548,437 B2 | * | 4/2003 | Sato et al. | 501/139 |
| 6,849,567 B2 | * | 2/2005 | Kim et al. | 501/139 |
| 6,876,538 B1 | * | 4/2005 | Kim et al. | 361/321.4 |
| 2002/0013213 A1 | | 1/2002 | Sato et al. | |
| 2004/0106510 A1 | * | 6/2004 | Kim et al. | 501/139 |
| 2007/0027020 A1 | * | 2/2007 | Sohn et al. | 501/65 |

FOREIGN PATENT DOCUMENTS

| | | | |
|---|---|---|---|
| JP | 2001006966 | * | 1/2001 |
| JP | 2002-080275 A | | 3/2002 |
| JP | 2002-308671 A | | 10/2002 |
| WO | WO 03-04415 A1 | | 1/2003 |

OTHER PUBLICATIONS

International Search Report of PCT/JP2006/305487 date of mailing May 30, 2006.

* cited by examiner

*Primary Examiner*—Karl E Group
(74) *Attorney, Agent, or Firm*—Westerman, Hattori, Daniels & Adrian, LLP

(57) ABSTRACT

A dielectric ceramic-forming composition capable of being sintered at a temperature lower than that in the known art and to be formed into a dielectric ceramic material having a high dielectric constant; and a dielectric ceramic material obtained from the dielectric ceramic-forming composition are provided.

The dielectric ceramic-forming composition includes a perovskite ($ABO_3$) ceramic material powder having an average particle size of 0.01 to 0.5 µm and a glass powder having an average particle size of 0.1 to 5 µm, wherein the content of the glass powder is 3 to 12 percent by weight. The perovskite ($ABO_3$) ceramic material powder is preferably a perovskite ($ABO_3$) ceramic material powder prepared by a wet reaction.

3 Claims, No Drawings

DIELECTRIC CERAMIC-FORMING COMPOSITION

TECHNICAL FIELD

The present invention relates to a dielectric ceramic-forming composition capable of being sintered at a low temperature and relates to a dielectric ceramic material obtained by firing the composition.

BACKGROUND ART

Perovskite ceramic materials have been used as electronic materials such as dielectric materials constituting multilayer capacitors, piezoelectric materials, and semiconductor materials. Barium titanate has been well-known as typical perovskite ceramic material.

In recent years, demands for miniaturization of electronic components have been increased. Thus, progress has been made in the reduction in thicknesses of sintered dielectric ceramic layers constituting electronic components. To reduce the thicknesses of sintered layers, it is necessary to reduce sizes of crystal grains in the sintered dielectric ceramic layers. In general, high-temperature sintering results in the growth of crystal grains. Thus, material powders such as barium titanate are strongly required to be sintered at low temperatures.

Hitherto, solid-phase methods each including heating a uniform mixture of a titanium oxide powder and a barium carbonate powder to a high temperature of 1,300° C. or higher to undergo a solid-phase reaction have been known as methods for producing barium titanate. However, solid-phase methods have disadvantages that uniform fine particles are not easily obtained and that low-temperature sintering does not easily occur. On the other hand, in wet methods have advantages that uniform fine particles are easily obtained and that the resulting barium titanate powder is easily sintered at a low temperature compared with the solid-phase method. Thus, wet methods are expected to be employed for the production of low-temperature-sintering barium titanate powders. Specific examples of such wet methods include (1) an oxalate method including allowing $TiCl_4$, $BaCl_2$, and oxalic acid to react in an aqueous solution to form the of the precipitate of $BaTiO(C_2O_4)_2 \cdot 4H_2O$ and then thermally decomposing the resulting precipitate; (2) hydrothermal synthesis including subjecting a mixture of barium hydroxide and titanium hydroxide to hydrothermal treatment and then calcining the resulting reaction product; (3) an alkoxide method including hydrolyzing a mixed alkoxide solution containing a barium alkoxide and a titanium alkoxide and then calcining the resulting hydrolysate; and (4) an ordinary-pressure thermal reaction method including calcining a hydrolysate obtained by hydrolysis of a titanium alkoxide in an aqueous barium hydroxide solution.

Although the use of the resulting barium titanate powders obtained by the wet methods slightly reduces sintering temperatures compared with those of powders obtained by the solid-phase methods, the sintering temperatures are high temperatures of 1,200° C. or higher. Disadvantageously, it is difficult to further reduce the sintering temperature.

Thus, various methods for preparing perovskite ceramic materials capable of being sintered at lower temperatures have been reported. Examples thereof include a method of incorporating lithium fluoride into barium titanate (for example, see Patent Document 1); and barium titanate containing, as an accessory component, at least one component selected from alkali metal components, niobium components, alkaline-earth metal components, bismuth components, zinc components, copper components, zirconium components, silica components, boron components, and cobalt components (for example, see Patent Document 2). The development of a material capable of being sintered at a further lower temperature and having a high dielectric constant has been required.

Patent Document 1: Japanese Unexamined Patent Application Publication No. 62-20201
Patent Document 2: Japanese Unexamined Patent Application Publication No. 2002-173368

DISCLOSURE OF INVENTION

Accordingly, it is an object of the present invention to provide a dielectric ceramic-forming composition capable of being sintered at a temperature lower than that in the known art and forming a dielectric ceramic material having a high dielectric constant and to provide the dielectric ceramic material.

In the above-described situation, the inventors have conducted intensive studies and have found that a perovskite ($ABO_3$) ceramic material powder having a specific particle size containing a specific amount of a glass powder having a specific particle size is easily sintered at a temperature as low as about 800° C. to 900° C. and that the resulting dielectric ceramic material sintered at a low temperature has a high dielectric constant. The findings have resulted in the completion of the present invention.

A dielectric ceramic-forming composition includes a perovskite ($ABO_3$) ceramic material powder having an average particle size of 0.01 to 0.5 μm and a glass powder having an average particle size of 0.1 to 5 μm, wherein the content of the glass powder is 3 to 12 percent by weight.

The perovskite ($ABO_3$) ceramic material powder is preferably a perovskite ($ABO_3$) ceramic material powder prepared by a wet reaction.

The perovskite ($ABO_3$) ceramic material powder preferably has a BET specific surface area of 2 $m^2/g$ or more.

In the perovskite ($ABO_3$) ceramic material powder, preferably, an A-site element is at least one element selected from the group consisting of Ba, Ca, and Sr, and a B-site element is at least one element selected from the group consisting of Ti and Zr.

In particular, the perovskite ($ABO_3$) ceramic material powder is preferably a barium titanate-based ceramic material powder represented by General Formula (I):

$$(Ba_{1-x}A^1_x)(Ti_{1-y}Zr_y)O_3 \tag{1}$$

(wherein $A^1$ represents at least one element selected from the group consisting of Ca and Sr; x is in the range of $0 < x \leq 0.25$; y is in the range of $0 \leq y \leq 0.20$).

The glass powder is preferably a glass powder containing boron.

The dielectric ceramic-forming composition is preferably prepared by wet-mixing the perovskite ($ABO_3$) ceramic material powder and the glass powder in an alcohol solvent.

A dielectric ceramic material according to the present invention is prepared by firing the above-described dielectric ceramic-forming composition. In this case, firing is preferably performed at 800° C. to 900° C.

The dielectric ceramic material preferably has a dielectric constant of 500 or more at a frequency of 1 kHz.

BEST MODE FOR CARRYING OUT THE INVENTION

The present invention will be described on the basis of preferred embodiments.

An important requirement is that a perovskite ($ABO_3$) ceramic material powder used for a dielectric ceramic-forming composition of the present invention has an average particle size of 0.01 to 0.5 μm and preferably 0.1 to 0.4 μm determined using a scanning electron micrograph (SEM).

The reason for this is described below. An average particle size of the perovskite ($ABO_3$) ceramic material powder of less than 0.01 μm results in the aggregation of particles, thus easily causing difficulty in handleability. Furthermore, mixing the material powder with a glass powder described below causes segregation, thus reducing uniformity. On the other hand, at an average particle size exceeding 0.5 μm, the resulting composition cannot be sintered at a low temperature of 900° C. or lower, and a dielectric constant is also low.

In the perovskite ($ABO_3$) ceramic material powder usable in the present invention, an A-site element is preferably at least one metal element selected from the group consisting of Ba, Ca, and Sr. A B-site element is preferably at least one element selected from the group consisting of Ti and Zr. Examples of a preferred compound include barium titanate, barium calcium zirconate titanate, barium zirconate titanate, and barium strontium titanate. Among these, the use of a barium titanate-based ceramic material powder represented by General Formula (1):

$$(Ba_{1-x}A^1{}_x)(Ti_{1-y}Zr_y)O_3 \quad (1)$$

(wherein $A^1$ represents at least one element selected from the group consisting of Ca and Sr; x is in the range of $0<x\leqq0.25$ and preferably $0<x\leqq0.20$; y is in the range of $0\leqq y\leqq0.20$ and preferably $0\leqq y\leqq0.16$) further increases the dielectric constant of the resulting dielectric ceramic material.

With respect to another physical property of the perovskite ($ABO_3$) ceramic material powder, a BET specific surface area is preferably 2 $m^2/g$ or more and more preferably 2.5 to 20 $m^2/g$. A specific surface area within the range above results in satisfactory sinterability and handleability to prepare a dielectric ceramic material with stable quality, which is preferred.

To improve the durability and reliability of the dielectric ceramic material without a reduction in dielectric constant, the perovskite ($ABO_3$) ceramic material powder may contain an accessory component element. In this case, the type, combination, and amount of accessory component element incorporated may be determined according to the known method. Examples of the accessory component element include rare-earth elements, Mn, Mg, Nb, and W. These may be used alone or in combination with two or more. The content of the accessory component element is preferably 5 to 12 mol % and more preferably 7.5 to 10 mol % with respect to the perovskite ($ABO_3$) ceramic material powder from the viewpoint that the composition can be sintered without a reduction in dielectric constant, which is particularly preferred.

A method for preparing the perovskite ($ABO_3$) ceramic material powder is not particularly limited as long as the ceramic material powder has an average particle size described above. The perovskite ($ABO_3$) ceramic material powder prepared by a wet reaction, a solid-phase reaction, or the like may be used. In particular, from the standpoint of an increase in the dielectric constant of the resulting dielectric ceramic material, a perovskite ($ABO_3$) ceramic material powder prepared by a wet reaction is preferably used. Examples of the wet reaction include coprecipitation, hydrolysis, hydrothermal synthesis, and an ordinary-pressure thermal reaction. In particular, a perovskite ($ABO_3$) ceramic material powder prepared by hydrolysis has a high dielectric constant and is thus preferred.

Examples of a method for preparing the perovskite ($ABO_3$) ceramic material powder used in the present invention by coprecipitation include a method including adding an alkali such as sodium hydroxide or an aqueous ammonia, as a coprecipitating agent, to an aqueous solution containing a chloride or hydroxide having an A-site element and a chloride or hydroxide having a B-site element to form either a mixture of hydrous oxides or a mixture of hydroxides containing the A-site element and the B-site element, pulverizing the mixture according to need, and calcining the mixture; a method including adding an organic acid such as oxalic acid or citric acid, as a coprecipitating agent, to an aqueous solution containing a chloride having an A-site element and a chloride having a B-site element to form an organic acid complex salt, pulverizing the organic acid complex salt according to need, and calcining the salt at 700° C. to 1,200° C. (reference: Japanese Examined Patent Application Publication No. 05-27570).

For example, a method for preparing the perovskite ($ABO_3$) ceramic material powder containing the accessory component element by coprecipitation includes mixing the hydrous oxide mixture, the hydroxide mixture, or the organic acid complex salt with an oxide, a hydroxide, a chloride, or a carbonate containing the accessory component element as a material to form a uniform mixture; and calcining the mixture at 700° C. to 1,200° C.

Examples of a method for preparing perovskite ($ABO_3$) ceramic material powder used in the present invention by hydrolysis include a method including adding water to a mixed alcohol solution containing metal alkoxides having an A-site element and a B-site element to perform hydrolysis and calcining the resulting product at 400° C. to 1,000° C. according to need; a method including adding an organic solvent containing a metal alkoxide having a B-site element to an aqueous solution containing a hydroxide of an A-site element to hydrolyze the metal alkoxide and calcining the product at 400° C. to 1,000° C. according to need; and a method including adding an organic solvent containing a metal alkoxide having a B-site element and a chloride of an A-site element to an aqueous solution containing a hydroxide of another A-site element to hydrolyze the metal alkoxide and calcining the product at 400° C. to 1,000° C. according to need.

For example, a method for preparing the perovskite ($ABO_3$) ceramic material powder containing the accessory component element by hydrolysis includes adding a metal alkoxide having the accessory component element and/or a water-soluble compound such as an acetic acid salt or a chloride salt of the accessory component element to the reaction solution and calcining the resulting product at 400° C. to 1,000° C. according to need.

A method for preparing a perovskite ($ABO_3$) ceramic material powder used in the present invention by hydrothermal synthesis includes adjusting the pH of a mixed solution of a hydroxide having a B-site element and a compound, such as a hydroxide or a chloride, having an A-site element to a pH value at which a reaction proceeds, usually 10 or more, with an alkali to obtain an alkaline mixed solution, performing a reaction usually at 100° C. to 300° C. under pressure, and calcining the resulting product at 400° C. to 1,000° C. according to need.

For example, a method for preparing a perovskite ($ABO_3$) ceramic material powder containing the accessory component element by hydrothermal synthesis includes adding a hydroxide, a chloride, or a carbonate, as a material, having the accessory component element to an aqueous mixed solution containing the A-site element and the B-site element to perform a hydrothermal synthesis reaction as described above and calcining the product at 400° C. to 1,000° C. according to need.

A method for preparing a perovskite ($ABO_3$) ceramic material powder used in the present invention by the ordinary-pressure thermal reaction includes adjusting the pH of a mixed solution containing a hydroxide, a chloride, or an oxide having a B-site element and a compound such as a hydroxide, a chloride, or a carbonate having an A-site element to a pH value at which a reaction proceeds, usually 10 or more, with an alkali to form an alkaline mixed solution, boiling the solution under normal pressure to perform the reaction, and calcining the resulting product at 400° C. to 1,000° C. according to need.

For example, a method for preparing a perovskite ($ABO_3$) ceramic material powder containing the accessory component element by the ordinary-pressure thermal reaction includes adding a hydroxide, a carbonate, an oxide, or chloride having the accessory component element to an aqueous mixed solution containing the A-site element and the B-site element to perform the ordinary-pressure thermal reaction as described above and calcining the resulting product at 400° C. to 1,000° C. according to need.

In the ordinary-pressure thermal reaction and hydrolysis, the wet reaction of a compound having a B-site element and a compound having an A-site element or the wet reaction of a compound having a B-site element, a compound having an A-site element, and a compound having an accessory component element may be performed in the presence of a chelating agent, such as ethylenediaminetetraacetic acid (EDTA), diethyleneaminepentaacetic acid (DTPA), nitrilotriacetic acid (NTA), triethylenetetrahexaacetic acid (TTHA), trans-1, 2-cyclohexanediamine-N,N,N',N'-tetraacetic acid (CDTA), or an ammonium salt, a sodium salt, or a potassium salt thereof, or hydrogen peroxide (see Japanese Unexamined Patent Application Publication No. 5-330824, Colloid and Surface, 32 (1988), p. 257-274).

The perovskite ($ABO_3$) ceramic material powder obtained by the wet reaction described above may be adjusted to have an average particle size within the range above by, according to need, pulverization or classification after the completion of the reaction and/or after calcination.

A method for preparing a perovskite ($ABO_3$) ceramic material powder used in the present invention by a solid-phase reaction includes uniformly mixing a barium carbonate powder and a titanium oxide powder and calcining the resulting compound at 900° C. to 1,300° C.

The shape of the perovskite ($ABO_3$) ceramic material powder is not particularly limited. Two or more perovskite ($ABO_3$) ceramic material powders having different particle shapes may be appropriately selected and used.

An important requirement is that a glass powder for use in the dielectric ceramic-forming composition of the present invention has an average particle size of 0.1 to 5 μm and preferably 0.5 to 1.5 μm determined with a scanning electron micrograph (SEM).

The reason for this is as follows: An average particle size of less than 0.1 μm facilitates aggregation. Mixing the glass powder and the perovskite ($ABO_3$) ceramic material powder causes segregation, thus eliminating uniformity. On the other hand, an average particle size exceeding 5 μm results in difficulty in sintering at 900° C. or lower.

Examples of the glass powder include $B_2O_3.Bi_2O_3$, $PbO.B_2O_3$, $PbO.SiO_2$, $PbO.B_2O_3.SiO_2$, $PbO.Al_2O_3.SiO_2$, $ZnO.PbO.B_2O_3$, $ZnO.B_2O_3$, $CaO.B_2O_3$, $CaO.B_2O_3.SiO_2$, $CaO.PbO.SiO_2$, $CaO.PbO.B_2O_3$ $SiO_2$, $CaO.SiO_2.Al_2O_3$, $CaO.MgO.SiO_2.Al_2O_3$, $CaO.B_2O_3.SiO_2.Al_2O_3$, $MgO.B_2O_3$, $MgO.B_2O_3.SiO_2$, $MgO.PbO.SiO_2$, $MgO.PbO.B_2O_3.SiO_2$, $MgO.SiO_2.Al_2O_3$, $MgO.B_2O_3.SiO_2.Al_2O_3$, $BaO.ZnO.B_2O_3$, $BaO.B_2O_3$, $BaO.B_2O_3.SiO_2$, $BaO.PbO.SiO_2$, $BaO.PbO.B_2O_3.SiO_2$, $BaO.SiO_2.Al_2O_3$, and $BaO.B_2O_3.SiO_2.Al_2O_3$. These may be used alone or in combination of two or more. Among these, lead-free glass powder is preferred in view of the environment.

Alternatively, the glass powder may contain at least one alkali metal oxide selected from the group consisting of $Li_2O$, $K_2O$, and $Na_2O$ and/or at least one compound selected from the group consisting of $TiO_2$, $ZrO_2$, $Cr_2O_3$, $CaF_2$, MnO, CuO, and $Y_2O_3$.

In the present invention, a glass powder preferably contains boron. The use of the glass powder containing boron results in a dielectric ceramic material having a significantly high dielectric constant even when sintering is performed at a low temperature of 800° C. to 900° C. The boron content of the glass powder is preferably in the range of 10 to 35 percent by weight and more preferably 10 to 30 percent by weight in terms of $B_2O_3$. Furthermore, the use of a glass powder having a glass transition temperature of 500° C. or lower and preferably in the range of 150° C. to 400° C. results in a higher dielectric constant.

In the present invention, a particularly preferable glass powder has a chemical composition described in item (1) or (2) below.

(1) LiO: 15 to 25 percent by weight and preferably 18 to 23 percent by weight; $B_2O_3$: 20 to 30 percent by weight and preferably 23 to 26 percent by weight; BaO: 10 to 30 percent by weight and preferably 15 to 25 percent by weight; CaO: 10 to 30 percent by weight and preferably 15 to 25 percent by weight; $SiO_2$: 10 to 30 percent by weight and preferably 10 to 20 percent by weight;

(2) LiO: 10 to 25 percent by weight and preferably 10 to 20 percent by weight; $B_2O_3$: 10 to 30 percent by weight and preferably 15 to 25 percent by weight; BaO: 10 to 30 percent by weight and preferably 15 to 30 percent by weight; CaO: 10 to 30 percent by weight and preferably 15 to 25 percent by weight; $SiO_2$: 10 to 30 percent by weight and preferably 15 to 25 percent by weight.

In addition to these components, if needed, the glass powder may further contain 0 to 0.5 percent by weight of $Al_2O_3$, 0 to 0.3 percent by weight of $K_2O$, and 0 to 0.5 percent by weight of MgO.

The content of the glass powder in the dielectric ceramic-forming composition is in the range of 3 to 12 percent by weight, preferably 5 to 10 percent by weight, and more preferably 7 to 10 percent by weight. A glass powder content of less than 3 percent by weight results in difficulty in sintering at 900° C. or lower. A glass powder content exceeding 12 percent by weight reduces the dielectric constant of the resulting dielectric ceramic material because of an excess amount of the glass powder.

The dielectric ceramic-forming composition of the present invention is prepared by mechanical means used in a wet or dry process, the mechanical means applying strong shear forces in such a manner that the perovskite ($ABO_3$) ceramic material powder and the glass powder are uniformly mixed in the above-described proportion. Examples of an apparatus used in the wet process include ball mills, Disper mill, homogenizers, vibration mills, sand grind mills, attritors, and strong agitators. Examples of an apparatus usable in the dry process include high-speed mixers, super mixers, turbo-sphere mixers, Henschel mixers, Nauta mixers, and ribbon blenders. Among these, in the present invention, preparation by the wet process is particularly preferred from the viewpoint of the formation of a uniform mixture and a dielectric ceramic material having a higher dielectric constant. In this case, examples of a solvent used in the wet process include water, methanol, ethanol, propanol, butanol, toluene, xylene, acetone, methylene chloride, ethyl acetate, dimethylformamide, and diethyl ether. Among these, the use of an alcohol, such as methanol, ethanol, propanol, or butanol, reduces the shift of a composition and improves the dielectric constant of the resulting dielectric ceramic material.

These uniform mixing operations are not limited to the exemplified mechanical means. Alternatively, an apparatus such as a jet mill, which simultaneously performs mixing and pulverization, may be used for the mixing operation. In this case, the adjustment of the particle size can be performed simultaneously.

The dielectric ceramic material of the present invention is prepared by firing the dielectric ceramic-forming composition. The firing temperature is not particularly limited as long as the dielectric ceramic-forming composition is sintered. In view of advantages of the present invention, the firing temperature is 700° C. and preferably 800° C. to 900° C. A firing time is 1 hour or more and preferably 1 to 2 hours. Non-limiting examples of an atmosphere during firing include air, an oxygen atmosphere, and an inert atmosphere. According to need, a plurality of firing operations may be performed.

The dielectric ceramic material of the present invention may be prepared by mixing a resin, a plasticizer, a solvent, and a dispersant according to need, which are known in this field, to the dielectric ceramic-forming composition to form a paste, applying the paste to a desired support, drying the paste, and firing the dry paste under the above-described firing conditions.

An example of a method of preparation by a green sheet process will be described.

One or more solvents, a plasticizer such as dibutyl phthalate, dioctyl phthalate, butylbenzyl phthalate, or dicapryl phthalate, according to need, and a dispersant such as a surfactant, if necessary, are added to the dielectric ceramic-forming composition of the present invention to form a slurry. Examples of the solvent include ethyl cellulose, polyvinyl butyral, resins such as acrylic resins and methacrylic resins, terpineol, diethylene glycol monobutyl ether acetate, ethylene glycol monomethyl ether, ethylene glycol monoethyl ether, ethylene glycol monobutyl ether, propylene glycol monomethyl ether, n-butyl acetate, amyl acetate, ethyl lactate, n-butyl lactate, methyl cellosolve acetate, ethyl cellosolve acetate, propylene glycol monomethyl ether acetate, ethyl-3-ethoxy propionate, 2,2,4-trimethyl-1,3-pentanediol monoisobutylate, toluene, xylene, isopropyl alcohol, methanol, ethanol, butanol, n-pentanol, 4-methyl-2-pentanol, cyclohexanol, diacetone alcohol, diethyl ketone, methyl butyl ketone, dipropyl ketone, and hexanone. The resulting slurry is applied to a film, such as a polyethylene terephthalate (PET) film, a polyethylene film, a polypropylene film, a polyester film, a polyimide film, an aramid film, a Kapton film, or a polymethylpentene film, by a doctor blade process to form a sheet. The sheet is dried to remove the solvent, thereby resulting in a green sheet. The green sheet is fired at 700° C. or higher and preferably 800° C. to 900° C. to form a thin-plate dielectric ceramic material.

The support is not limited to such a plastic support. Metal foil and a glass plate used for a plasma display panel may be used.

The dielectric ceramic material of the present invention is sintered at a low temperature of 900° C. or lower, in particular, 800° C. to 900° C. but preferably has a high dielectric constant of 500 or more, more preferably 800 or more, and most preferably 1,000 or more at a frequency of 1 kHz. Therefore, for example, the dielectric ceramic material may be used as dielectric materials for use in thin-layer ceramic capacitors. Furthermore, the dielectric ceramic material may be suitably used as dielectric materials for use in printed circuit boards, multilayer printed circuit boards, electrode ceramic circuit boards, glass ceramic circuit boards, peripheries of circuits, and electronic devices for inorganic EL and plasma displays.

EXAMPLES

The present invention will be described in detail by means of examples. However, the present invention is not limited to these examples.

Examples 1 to 13 and Comparative Examples 1 to 3

<Perovskite ($ABO_3$) Ceramic Material Powder>

(Preparation of Barium Calcium Zirconate Titanate)

Water (600 g) was charged into a 2-L reaction vessel. Barium hydroxide ($Ba(OH)_2 \cdot 8H_2O$, 184 g) was dissolved therein at 90° C. A mixed solution of calcium chloride (6 g), titanium butoxide (160 g), and zirconium butoxide (52 g) was added dropwise to the resulting solution to perform hydrolysis. The vessel was heated to 90° C. at a heating rate of 30° C./hour and maintained at 90° C. for 1 hour. Heating and stirring were stopped to cool off the vessel. A Buechner funnel was set to a filter bottle. Solid-liquid separation was performed by suction with an aspirator. The resulting product had a barium-rich composition. Thus, the product was washed with an aqueous solution containing acetic acid so as to have a molar ratio to barium to titanium of 1.005±0.005, and dried. The product was calcined at 600° C. to 1,100° C. for 10 hours, pulverized, and classified to prepare $(Ba_{0.95}Ca_{0.05})(Ti_{0.85}Zr_{0.15})O_3$ powder samples having various particle sizes.

Table 1 shows physical properties of the resulting $(Ba_{0.95}Ca_{0.05})(Ti_{0.85}Zr_{0.15})O_3$ powder samples (hereinafter, referred to as "BCTZ powder samples"). The average particle size was determined by the observation with a scanning electron micrograph.

TABLE 1

| BCTZ powder sample | Average particle size (μm) | BET specific surface area ($m^2/g$) |
|---|---|---|
| A | 0.08 | 22.5 |
| B | 0.10 | 19.9 |
| C | 0.17 | 9.6 |
| D | 0.25 | 7.4 |
| E | 0.60 | 2.3 |

(Glass Powder)

Commercially available glass powders shown in Table 2 were used.

TABLE 2

| Glass powder sample | Composition | Glass transition temperature (° C.) | Crystallization temperature (° C.) | Average particle size (μm) |
|---|---|---|---|---|
| a | $B_2O_3$: 24.16 wt % BaO: 19.77 wt % CaO: 18.27 wt % $Li_2O$: 20.92 wt % $SiO_2$: 16.05 wt % $Al_2O_3$: 0.12 wt % | 330 | 462 | 1.28 |

TABLE 2-continued

| Glass powder sample | Composition | Glass transition temperature (°C.) | Crystallization temperature (°C.) | Average particle size (μm) |
|---|---|---|---|---|
| b | $K_2O$: 0.19 wt %<br>MgO: 0.27 wt %<br>SrO: 0.25 wt %<br>$B_2O_3$: 18.91 wt %<br>BaO: 25.04 wt %<br>CaO: 21.65 wt %<br>$Li_2O$: 14.68 wt %<br>$SiO_2$: 18.81 wt %<br>$Al_2O_3$: 0.15 wt %<br>$K_2O$: 0.20 wt %<br>MgO: 0.30 wt %<br>SrO: 0.26 wt % | 370 | 523 | 1.08 |
| c | $B_2O_3$: 24.64 wt %<br>BaO: 22.45 wt %<br>CaO::21.25 wt %<br>$Li_2O$::12.71 wt %<br>$SiO_2$: 17.96 wt %<br>$Al_2O_3$: 0.11 wt %<br>$K_2O$: 0.22 wt %<br>MgO: 0.33 wt %<br>SrO: 0.33 wt % | 402 | 591 | 1.06 |

(Preparation of Dielectric Ceramic-Forming Composition)

The BCTZ powder samples and the glass powder samples were weighed in such a manner that the total weight thereof was 80 g and that the compositions shown in Table 3 were satisfied. Ethanol (140 mL) was added. The resulting mixtures were mixed with a wet ball mill for 16 hours to prepare dielectric ceramic-forming compositions in which each material was uniformly dispersed.

TABLE 3

| | BCTZ powder sample | | Glass powder sample | |
|---|---|---|---|---|
| | Type | Content (wt %) | Type | Content (wt %) |
| Example 1 | D | 90 | a | 10 |
| Example 2 | D | 90 | b | 10 |
| Example 3 | D | 90 | c | 10 |
| Example 4 | D | 97 | b | 3 |
| Example 5 | D | 95 | b | 5 |
| Example 6 | D | 93 | b | 7 |
| Example 7 | D | 91.5 | b | 8.5 |
| Example 8 | D | 90 | b | 10 |
| Example 9 | D | 88 | b | 12 |
| Example 10 | A | 90 | b | 10 |
| Example 11 | B | 90 | b | 10 |
| Exampl2 12 | C | 90 | b | 10 |
| Example 13 | D | 90 | b | 10 |
| Comparative example 1 | D | 100 | — | — |
| Comparative example 2 | D | 99 | b | 1 |
| Comparative example 3 | E | 90 | b | 10 |

(Preparation of Dielectric Ceramic Material)

Each of the resulting dielectric ceramic-forming compositions and a 5% polyvinyl alcohol solution were sufficiently mixed with a mortar. After granulation was performed in such a manner the particle size was 250 μm mesh or less, single plates each having a diameter of 5 mm were formed by press molding. The single plates were fired at 800° C. or 850° C. for 2 hours in air.

(Evaluation of Physical Property of Dielectric Ceramic)

Platinum electrodes were deposited by evaporation on both surfaces of each single plate of the dielectric ceramic material, and electrical characteristics were measured. Table 4 shows the results. Dielectric constants were measured with an LCR meter at a frequency of 1 kHx, a voltage of 1 V, and a temperature in the range of –55° C. to 155° C.

TABLE 4

| | Firing temperature: 800° C. | | Firing temperature: 850° C. | |
|---|---|---|---|---|
| | Sintered density | Dielectric ceramic | Sintered density | Dielectric ceramic |
| Example 1 | 4.53 | 722 | 4.80 | 952 |
| Example 2 | 4.56 | 682 | 5.11 | 1159 |
| Example 3 | 4.70 | 545 | 5.07 | 867 |
| Example 4 | 3.47 | 330 | 4.38 | 625 |
| Example 5 | 3.71 | 306 | 4.78 | 894 |
| Example 6 | 4.19 | 457 | 5.17 | 1153 |
| Example 7 | 4.70 | 527 | 5.23 | 839 |
| Example 8 | 4.56 | 682 | 5.11 | 1167 |
| Example 9 | 4.98 | 670 | 5.10 | 992 |
| Example 10 | 4.64 | 903 | 5.14 | 1516 |
| Example 11 | 4.82 | 1160 | 5.03 | 1653 |
| Exampl2 12 | 4.54 | 849 | 5.16 | 1335 |
| Example 13 | 4.56 | 682 | 5.11 | 1167 |
| Comparative example 1 | Not sintered | | Not sintered | |
| Comparative example 2 | 2.86 | 135 | 3.34 | 274 |
| Comparative example 3 | 3.84 | 176 | 4.42 | 358 |

Table 4 clearly shows that the dielectric ceramic material obtained from the dielectric ceramic-forming composition in each of Examples 1 to 13 has a high dielectric constant even when firing is performed at a low temperature of 800° C. or 850° C., as compared with those in Comparative Examples 1 to 3.

Examples 14 and 15

<Perovskite ($ABO_3$) Ceramic Material Powder>

(1) Preparation of Barium Calcium Zirconate Titanate Sample

Water (3,000 g) was charged into a 10-L reaction vessel. Barium hydroxide ($Ba(OH)_2.8H_2O$, 920 g) was dissolved therein at 90° C. A mixed solution of calcium chloride (30 g), titanium butoxide (800 g), and zirconium butoxide (260 g) was added dropwise to the resulting solution to perform hydrolysis. The vessel was heated to 90° C. at a heating rate of 30° C./hour and maintained at 90° C. for 1 hour. Heating and stirring were stopped to cool off the vessel. A Buechner funnel was set to a filter bottle. Solid-liquid separation was performed by suction with an aspirator. The resulting product had a barium-rich composition. Thus, the product was washed with an aqueous solution containing acetic acid so as to have a molar ratio to barium to titanium of 1.005±0.005, and dried. The product was calcined at 800° C. for 10 hours, pulverized, and classified to prepare a $(Ba_{0.95}Ca_{0.05})(Ti_{0.85}Zr_{0.15})O_3$ powder sample.

Table 5 shows physical properties of the resulting $(Ba_{0.95}Ca_{0.05})(Ti_{0.95}Zr_{0.15})O_3$ powder sample (hereinafter, referred to as "BCTZ powder sample F"). The average particle size was determined by the observation with a scanning electron micrograph.

(2) Preparation of Barium Strontium Titanate

Water (4,300 g) was charged into a 10-L reaction vessel. Barium hydroxide ($Ba(OH)_2.8H_2O$, 715 g) and strontium hydroxide ($Sr(OH)_2.8H_2O$, 270 g) were dissolved therein at 90° C. Titanium butoxide (1094 g) was added dropwise to the resulting solution to perform hydrolysis. The vessel was heated to 90° C. at a heating rate of 30° C./hour and maintained at 90° C. for 1 hour. Heating and stirring were stopped to cool off the vessel. A Buechner funnel was set to a filter bottle. Solid-liquid separation was performed by suction with an aspirator. The resulting product had a barium-rich composition. Thus, the product was washed with deionized water so as to have a molar ratio to barium to titanium of 1.005±0.005, and dried. The product was calcined at 700° C. for 10 hours, pulverized, and classified to prepare a $(Ba_{0.78}Sr_{0.22})TiO_3$ powder sample.

Table 5 shows physical properties of the resulting $(Ba_{0.78}Sr_{0.22})TiO_3$ powder sample (hereinafter, referred to as a "BST powder sample"). The average particle size was determined by the observation with a scanning electron micrograph.

TABLE 5

|  | Average particle size (μm) | BET specific surface area (m²/g) |
|---|---|---|
| BCTZ powder sample F | 0.07 | 15.3 |
| BST powder sample | 0.10 | 10.9 |

The resulting perovskite compound oxide sample (BCTZ sample F or BST powder sample) (90 parts by weight), the glass powder sample B (10 parts by weight) used in Examples 1 to 13, and ethanol (140 mL) were mixed with a wet ball mill for 16 hours to prepare a dielectric ceramic-forming composition in which each material was uniformly dispersed. In the same way as in Examples 1 to 13, the resulting dielectric ceramic-forming composition and a 5% polyvinyl alcohol solution were sufficiently mixed with a mortar. After granulation was performed in such a manner the particle size was 250 μm mesh or less, single plates each having a diameter of 5 mm were formed by press molding. The single plates were fired at 850° C. for 2 hours in air. The temperature characteristics of the resulting single plates were measured. Table 6 shows the results.

TABLE 6

|  | Dielectric constant | ΔC. − 55° C. (%) | ΔC. − 30° C. (%) | ΔC. + 85° C. (%) |
|---|---|---|---|---|
| Example 14 | 1500 | −47.7 | −34.9 | −0.1 |
| Example 15 | 1070 | −8.7 | −4.4 | +6.1 |

Table 6 clearly shows that in Example 14, the rate of capacitance change is in the range of +22% to −82% at a temperature range of −30° C. to +85° C. and satisfies Y5V specifications defined by EIA standards and that in Example 15, the rate of capacitance change is in the range of +15% to −15% at a temperature range of −55° C. to +85° C. and satisfies X5R specifications.

INDUSTRIAL APPLICABILITY

According to the present invention, even when sintering is performed at a temperature lower than the known art, a dielectric ceramic material is obtained having a high dielectric constant. The resulting dielectric ceramic material can be used as dielectric materials for use in thin-layer ceramic capacitors. Furthermore, the dielectric ceramic material may be suitably used as dielectric materials for use in printed circuit boards, multilayer printed circuit boards, ceramic circuit boards, glass ceramic circuit boards, peripheries of circuits, and electronic devices for inorganic EL and plasma displays.

The invention claimed is:

1. A dielectric ceramic-forming composition obtained by wet process, comprising
   a perovskite ($ABO_3$) ceramic material powder having an average particle size of 0.01 to 0.5 μm and a BET specific surface area greater than 2 m²/g and
   a glass powder having an average particle size of 0.1 to 5 μm,
   which dielectric ceramic-forming composition is obtained by wet-mixing said perovskite ceramic material powder and said glass powder in a solvent solution of one or more solvents selected from the group consisting of methanol, ethanol, propanol, butanol, toluene, xylene, acetone, methylene chloride, ethyl acetate, dimethyl formamide, and diethyl ether,
   wherein the content of the glass powder is 3 to 12 percent by weight;
   wherein the glass powder is a glass powder containing $B_2O_3$; and
   wherein the content of the $B_2O_3$ is 10-35% by weight.

2. The dielectric ceramic-forming composition according to claim 1, wherein in the perovskite ($ABO_3$) ceramic material powder, an A-site element is at least one element selected from the group consisting of Ba, Ca, and Sr, and a B-site element is at least one element selected from the group consisting of Ti and Zr.

3. The dielectric ceramic-forming composition according to claim 1, wherein the perovskite ($ABO_3$) ceramic material powder is a barium titanate-based ceramic material powder represented by General Formula (1):

$$(Ba_{1-x}A^1{}_x)(Ti_{1-y}Zr_y)O_3 \qquad (1)$$

(wherein $A^1$ represents at least one element selected from the group consisting of Ca and Sr; x is in the range of $0 < x \leqq 0.25$; y is in the range of $0 \leqq y \leqq 0.20$).

* * * * *